United States Patent

Bowler

[11] Patent Number: 5,854,738
[45] Date of Patent: Dec. 29, 1998

[54] APPARATUS FOR SUPPORTING A COOLING ASSEMBLY COUPLED TO AN INTEGRATED CIRCUIT

[75] Inventor: Victor A. Bowler, Folsom, Calif.

[73] Assignee: Intel Corporation, Santa Clara, Calif.

[21] Appl. No.: 866,163

[22] Filed: May 30, 1997

[51] Int. Cl.⁶ .................................................. H05K 7/20
[52] U.S. Cl. ................... 361/695; 361/697; 165/803; 165/185; 257/718; 257/719
[58] Field of Search .................................... 361/695, 694, 361/697, 704; 257/717, 713, 719; 165/80.3, 185

[56] References Cited

U.S. PATENT DOCUMENTS

| | | | |
|---|---|---|---|
| 4,847,449 | 7/1989 | Jordan et al. | 174/16.3 |
| 5,339,214 | 8/1994 | Nelson . | |
| 5,368,094 | 11/1994 | Hung . | |
| 5,406,451 | 4/1995 | Korinsky . | |
| 5,430,610 | 7/1995 | Hung . | |
| 5,482,113 | 1/1996 | Agonafer et al. . | |
| 5,502,619 | 3/1996 | Wang . | |
| 5,504,650 | 4/1996 | Katsui et al. . | |
| 5,615,998 | 4/1997 | Kodama et al. . | |
| 5,629,834 | 5/1997 | Kodama et al. . | |

*Primary Examiner*—Leo P. Picard
*Assistant Examiner*—Boris L. Chervinsky
*Attorney, Agent, or Firm*—Blakely, Sokoloff, Taylor & Zafman LLP

[57] ABSTRACT

An apparatus and method for supporting a cooling assembly that is coupled to an integrated circuit package that is perpendicularly mounted on a printed circuit board (PCB). The apparatus includes a support bracket that engages the cooling assembly and extends over the PCB, a standoff which attaches to the PCB, and a retaining latch which detachably couples the support bracket to the standoff. In one embodiment, two apparatuses, one at each side end of the IC package are employed to support the cooling assembly. In one embodiment, the support bracket is triangular in shape, and engages the cooling assembly with wrap-around attachment tabs that fit into receiving grooves complementarily disposed on the cooling assembly. The retaining latch fits into a guided groove on a foot of the support bracket. A coupling slot in the foot of the support bracket is aligned with a corresponding mounting hole in the PCB. The standoff inserts into a mounting hole in the PCB, and a shouldered head portion of the standoff extends into the coupling slot of the support bracket. The retaining latch can slide in the guided groove to snuggedly receive or disengage the neck portion of the standoff.

14 Claims, 3 Drawing Sheets

APPARATUS FOR SUPPORTING A COOLING ASSEMBLY COUPLED TO AN INTEGRATED CIRCUIT

BACKGROUND OF THE INVENTION

1. Field of the Invention

The present invention pertains to the field of integrated circuits. More particularly, this invention relates to supporting a cooling assembly coupled to an integrated circuit package.

2. Background

Advances in integrated circuit technology have led to greater densities of transistors and faster clock frequencies which in turn have led to more powerful microprocessors. These increases have also resulted in a corresponding increase in heat generated by the integrated circuits. With large amounts of heat being generated, larger cooling assemblies must be employed. For example, large aluminum heat sinks are often used. In U.S. patent application Ser. No. 08/739,815, filed on Oct. 30, 1996, having common assignee with the present application, a new approach to packaging microprocessors is disclosed. In U.S. patent application Ser. No. 08/741,023, filed on Oct. 30, 1996, having common assignee with the present application, a retention assembly for retaining this new processor package is disclosed. In U.S. patent application Ser. No. 08/866869, entitled "Method and Apparatus for Cooling Integrated Circuits Using a Shrouded Heat Sink with an Affixed Fan," filed contemporaneously with the present application and having common assignee with the present application, an improved cooling assembly is disclosed. The heat sink and integrated fan of the improved cooling assembly can add considerable outboard weight and mass to the processor package, which can cause the combined structure to fail during shock and vibration conditions. Therefore, an additional support structure is needed for the heat sink and fan assembly.

SUMMARY OF THE INVENTION

The present invention is an apparatus for supporting a cooling assembly that is coupled to an integrated circuit package that is perpendicularly mounted on a printed circuit board (PCB). The apparatus includes a support bracket that engages the cooling assembly and extends over the PCB, a standoff which attaches to the PCB, and a retaining latch which detachably couples the support bracket to the standoff. In one embodiment, two apparatuses, one at each side end of the IC package, are employed to support the cooling assembly.

In one embodiment, the support bracket is triangular in shape, and engages the cooling assembly with wrap-around attachment tabs that fit into receiving grooves complementarily disposed on the cooling assembly. The retaining latch fits into a guided groove on a foot of the support bracket. A coupling slot in the foot of the support bracket is aligned with a corresponding mounting hole in the PCB. The standoff inserts into a mounting hole in the PCB, and a shouldered head portion of the standoff extends into the coupling slot of the support bracket. The retaining latch can slide in the guided groove to snuggedly receive or disengage the neck portion of the standoff.

DETAILED DESCRIPTION

In the following detailed description numerous specific details are set forth in order to provide a thorough understanding of the present invention. However, it will be understood by those skilled in the art that the present invention may be practiced without these specific details. In other instances well known methods, procedures, components, and circuits have not been described in detail so as not to obscure the present invention.

Figure 1:
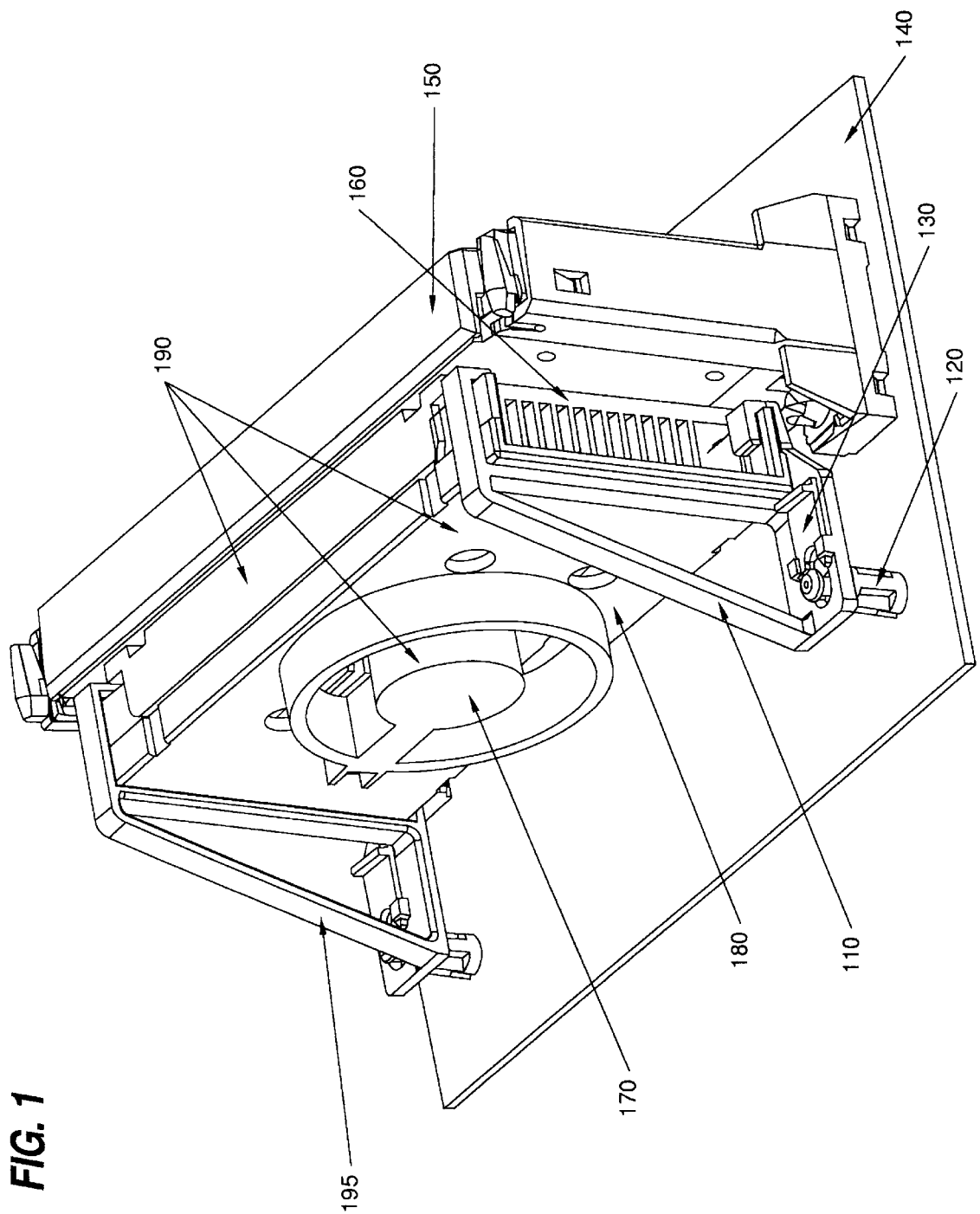
FIG. 1 illustrates one embodiment of the present invention.

FIG. 1 illustrates one embodiment of the present invention. As shown, an integrated circuit (IC) package 150 is similar to the processor package disclosed in U.S. patent application 08/739,815, discussed above. The IC package 150 is perpendicularly mounted on printed circuit board (PCB) 140. Cooling assembly 190 is similar to the one disclosed in U.S. patent application Ser. No. 08/866,869, discussed above. The cooling assembly 190 is coupled to the IC package 150. The cooling assembly 190 includes the heat sink 160, the fan 170, and the shroud 180, wherein the fan 170 and the shroud 180 are integrated together and snap onto the heat sink 160. In accordance with the present invention, a support apparatus including the support bracket 110, the standoff 120, and the retaining latch 130, supports and secures added weight from the cooling assembly 190. In the illustrated embodiment, a second support bracket 195, which is a mirror copy of bracket 110, is also employed to support cooling assembly 190.

Figure 2:
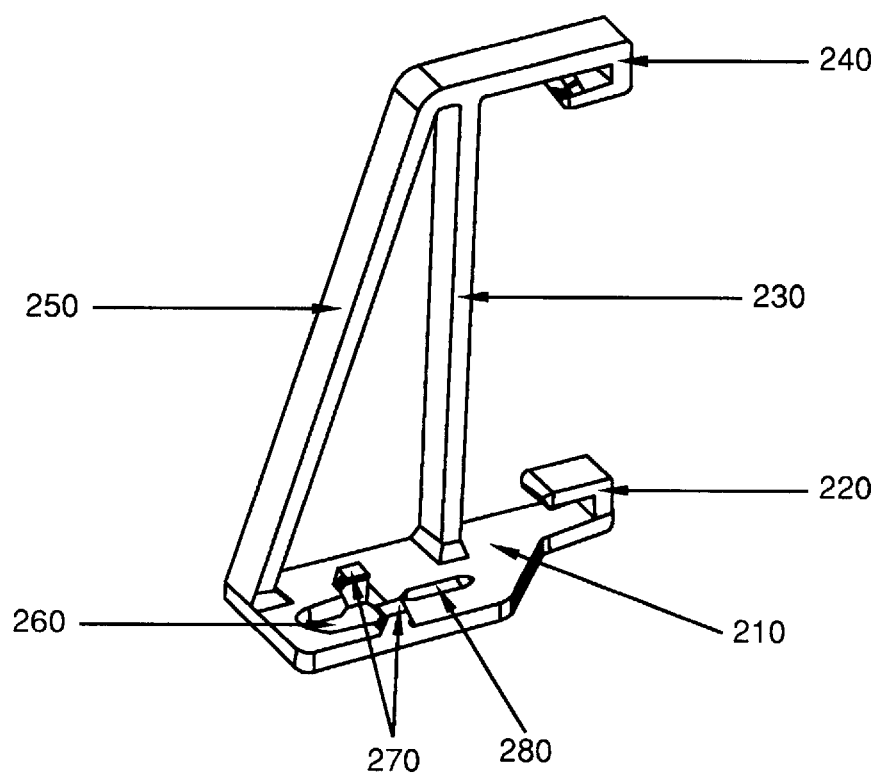
FIG. 2 illustrates one embodiment of a support bracket.

FIG. 2 illustrates one embodiment of the support bracket 110. As shown, the bracket 110 has a foot portion 210, a first wrap-around attachment tab 220, a vertical support 230, a second wrap-around attachment tab 240, a hypotenuse support rib 250, a coupling slot 260, a pair of right-angular guides 270, and a guide groove 280. As shown in FIG. 1, the wrap-around attachment tabs 220 and 240 engage the cooling assembly 190 at receiving grooves on the shroud 180. The support bracket 110 extends out over the PCB 140.

Figure 3:
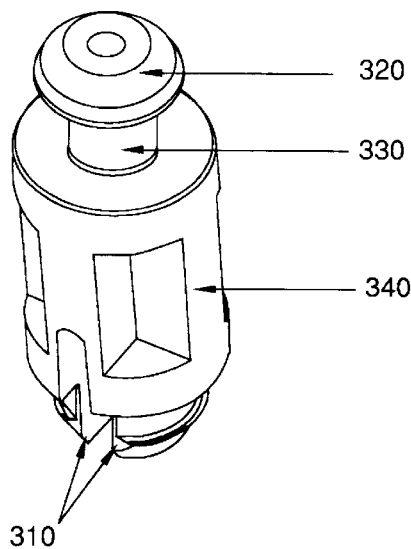
FIG. 3 illustrates one embodiment of a standoff.

FIG. 3 illustrates one embodiment of the standoff 120. As shown, the standoff 120 has a pair of grip tangs 310, a shaft portion 340, and a chamfered shouldered head 320 with a neck portion 330. The slit between the grip tangs 310 allow them to collapse together and bend back. The ends of the grip tangs 310 are tapered so that they collapse together when they are pushed into a mounting hole in the PCB 140. Different sized grip tangs 310 can be used for different sized mounting holes. The grip tangs 310 also have a rim near the end so that when they are pushed through a mounting hole, they snap and grip the backside of the PCB 140.

The shaft 340 has a cross section that is larger than the mounting hole. The grip tangs 310 are just long enough so that the shaft 340 rests on the PCB 140 when the grip tangs 310 snap into place. In this way, the standoff is securely attached to the PCB 140. The grip tangs 310 can be removed by collapsing the tangs 310 at the back side of the PCB 140, and pulling the standoff 120 out of the mounting hole.

The chamfered shouldered head 320 can be guided into the coupling slot 260. The shaft 340 has a cross section larger than the coupling slot 260, and the shaft is long enough so that the foot 210 rests on the shaft 340, while the head 320 sits above the foot 210, leaving neck 330 extended through slot 260.

Figure 4:
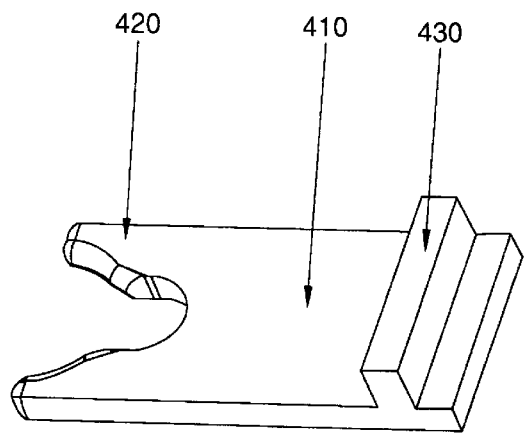
FIG. 4 illustrates one embodiment of a retaining latch.
Figure 5:
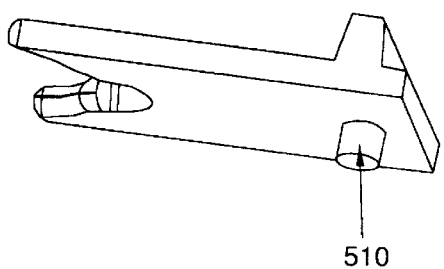
FIG. 5 shows a side view of FIG. 4.

FIGS. 4 and 5 illustrate one embodiment of the retaining latch 130. As shown, the retaining latch 130 has a planar body 410, a snapping clip 420, a grip tab 430, and a guide tab 510. The planar body 410 is captured by, and slides between, the right angular guides 270. The guide tab 510 slides in the guide groove 280, thereby limiting latch 130's maximum travel and keeping latch 130 captured. When the head 320 of the standoff 120 is protruding through the coupling slot 260, the retaining latch 130 can slide back and forth to snap the clip 420 onto the neck 330 or disengage the clip 420 from the neck.

In this way, the support apparatus beneficially supports and secures additional weight from the cooling assembly 190, while providing for easy attachment or removal of the IC package 150 from the PCB 140. In one embodiment, the support bracket 110, standoff 120, and retaining latch 130 are made of polycarbonate Lexan 940.

Whereas many alterations and modifications of the present invention will be comprehended by a person skilled in the art after having read the foregoing description, it is to be understood that the particular embodiments shown and described by way of illustration are in no way intended to be considered limiting. Therefore, references to details of particular embodiments are not intended to limit the scope of the claims, which in themselves recite only those features regarded as essential to the invention.

What is claimed is:

1. A support apparatus for an integrated circuit (IC) cooling assembly, comprising:

a triangulated support bracket having a first and a second wrap-around attachment tab to engage the IC cooling assembly at a bottom and a top receiving groove respectively in the IC cooling assembly, wherein, in an installed position, a foot of the support bracket is disposed in parallel to a printed circuit board (PCB), a vertical support of the support bracket extends vertically downwardly from the second wrap-around attachment tab toward the PCB, and the support bracket extends horizontally over the PCB;

a standoff for removably attaching to the PCB; and a retaining latch which detachably couples the support bracket to the standoff.

2. The support apparatus of claim 1, wherein the foot further comprises:

a coupling slot in the foot to be aligned with a corresponding mounting hole in the PCB.

3. The support apparatus of claim 2, wherein the foot further comprises:

a pair of opposing right angular guides on a top surface of the foot, one right angular guide on each side of the coupling slot.

4. The support apparatus of claim 3, wherein the retaining latch further comprises:

a planar body insert and slide between the opposing right angular guides.

5. The support apparatus of claim 2, wherein the foot further comprises:

a guide groove in a length of a top surface of the foot.

6. The support apparatus of claim 5, wherein the retaining latch further comprises:

a guide tab of the bottom surface of the retaining latch, to slide and insert into the guide groove.

7. The support apparatus of claim 1, wherein the support bracket comprises:

a hypotenuse support rib which extends from the second wrap-around attachment tab acutely angularly downward toward the PCB in the installed position.

8. The support apparatus of claim 1, wherein the standoff comprises:

a first end comprising a pair of grip tangs to collapsibly insert into a mounting hole in the PCB.

9. The support apparatus of claim 8, wherein the standoff further comprises:

a second end comprising a chamfered shouldered head to be guidably inserted into a coupling slot in the support bracket.

10. The support apparatus of claim 9, wherein the retaining latch further comprises:

a snapping clip at a first end of the retaining latch to snuggedly receive a neck portion of the chamfered shouldered head.

11. The support apparatus of claim 1, wherein the standoff comprises:

a shaft that extends from a first end to a second end of the standoff, the shaft having a cross-section larger than a cross-section of a mounting hole in the PCB and a coupling slot in the support bracket.

12. The support apparatus of claim 1, wherein the IC cooling assembly is comprised of:

a heat sink thermally connected to the integrated circuit package;

an integral fan coupled to the heat sink; and a shroud coupled to and partially enclosing the heat sink.

13. The support apparatus of claim 1, wherein at least one of the support bracket, standoff, and retaining latch is constituted with a polycarbonate material.

14. A system comprising:

a printed circuit board (PCB);

an integrated circuit (IC) package mounted substantially vertically on the PCB;

an IC cooling assembly thermally coupled to the IC package to cool the IC package;

a plurality of support apparatuses, each operative to engage the IC cooling assembly at a plurality of locations on the IC cooling assembly, and detachably couple the IC cooling assembly to the PCB, each support apparatus including:

a support bracket having a first and a second wrap-around attachment tab which engages the IC cooling assembly at a bottom and a top receiving groove respectively in the IC cooling assembly, a foot disposed in parallel to the PCB, and a vertical support extending vertically downwardly from the second wrap-around attachment tab toward the PCB, wherein the support bracket extends horizontally over the PCB;

a standoff removably attached to the PCB; and a retaining latch which detachably couples the support bracket to the standoff.

* * * * *